US012660323B2

(12) United States Patent　　　　　(10) Patent No.:　US 12,660,323 B2
Wu et al.　　　　　　　　　　　　　　　(45) **Date of Patent:　　*Jun. 16, 2026**

(54) ELECTRONIC DEVICE

(71) Applicant: InnoLux Corporation, Miao-Li County (TW)

(72) Inventors: Hsi-Chia Wu, Miao-Li County (TW); Mei-Hsiu Pan, Miao-Li County (TW); Tzu-Yi Liu, Miao-Li County (TW); Chung-Wen Yen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/919,649

(22) Filed: Oct. 18, 2024

(65) Prior Publication Data

US 2025/0048740 A1　　　Feb. 6, 2025

Related U.S. Application Data

(63) Continuation of application No. 18/301,362, filed on Apr. 17, 2023, now Pat. No. 12,148,764.

(30) Foreign Application Priority Data

May 31, 2022　　(CN) ......................... 202210608661.7

(51) Int. Cl.
　　*G09G 3/32*　　　　(2016.01)
　　*H10D 86/40*　　　(2025.01)
　　*H10D 86/60*　　　(2025.01)
(52) U.S. Cl.
　　CPC ............... *H10D 86/60* (2025.01); *G09G 3/32* (2013.01); *H10D 86/441* (2025.01);
　　　　　　　　　　　(Continued)

(58) Field of Classification Search
　　CPC ............................... H01L 27/124; G09G 3/32; G09G 2300/0408; G09G 2300/0426;
　　　　　　　　　　　(Continued)

(56) References Cited

U.S. PATENT DOCUMENTS

2021/0327362 A1 * 10/2021 Park ..................... H10K 59/123

FOREIGN PATENT DOCUMENTS

| CN | 112634802 A | 4/2021 |
| CN | 112771599 A | 5/2021 |
| CN | 112992246 A | 6/2021 |

OTHER PUBLICATIONS

Chinese language office action dated Apr. 11, 2026, issued in application No. CN 202210608661.7.

* cited by examiner

*Primary Examiner* — Towfiq Elahi

(74) *Attorney, Agent, or Firm* — McClure, Qualey & Rodack, LLP

(57)　　　　　　　　ABSTRACT

An electronic device includes a substrate, first and second driving units, a first bus line and a first signal line. The first and the second driving units are disposed on the substrate and arranged along a first direction. The first bus line is disposed on the substrate and extends along the first direction. The first signal line has a main portion, a first branch portion, and a second branch portion. The main portion is electrically connected to the first bus line and extends along a second direction different the first direction, and the first branch portion and the second branch portion extend from the main portion in opposite direction. The first driving unit has a first transistor. The second driving unit has a second transistor. The first branch portion is electrically connected to the first transistor. The second branch portion is electrically connected to the second transistor.

6 Claims, 7 Drawing Sheets

(52) U.S. Cl.
 CPC .............. *G09G 2300/0408* (2013.01); *G09G
  2300/0426* (2013.01); *G09G 2300/08*
  (2013.01)

(58) Field of Classification Search
 CPC ....... G09G 2300/08; G09G 2310/0286; G09G
  3/3266; G11C 19/28
 See application file for complete search history.

ELECTRONIC DEVICE

CROSS REFERENCE TO RELATED APPLICATIONS

This application is a Continuation of U.S. patent application Ser. No. 18/301,362, filed Apr. 17, 2023, now U.S. Pat. No. 12,148,764, which claims priority of China Patent Application No. 202210608661.7 filed on May 31, 2022, the entirety of which is incorporated by reference herein.

BACKGROUND OF THE DISCLOSURE

Field of the Disclosure

The disclosure relates to an electronic device, and in particular, to an electronic device capable of reducing layout space.

Description of the Related Art

The signal stage gate on panel (GOP) driving circuit of the display panel of a conventional electronic device may need multiple sets of driving signals. Different function blocks in the signal stage gate on panel driving circuit may be connected to different driving signal lines. However, the driving signal lines may be disposed around the gate on panel driving unit, and then connected one by one to the function blocks of each stage gate on panel driving unit, which may increase the amount of available space in the layout of the electronic device. Therefore, a new design for a circuit structure is needed to solve the problem described above.

BRIEF SUMMARY OF THE DISCLOSURE

An embodiment of the disclosure provides an electronic device, which includes a substrate, a first driving unit and a second driving unit, a first bus line and a first signal line and. The first driving unit and the second driving unit are disposed on the substrate and arranged along a first direction. The first bus line is disposed on the substrate and extends along the first direction. The first signal line has a main portion, a first branch portion, and a second branch portion. The main portion is electrically connected to the first bus line and extends along a second direction different the first direction, and the first branch portion and the second branch portion extend from the main portion in opposite direction. The first driving unit has a first transistor and the second driving unit has a second transistor, the first branch portion of the first signal line is electrically connected to the first transistor, and the second branch portion of the first signal line is electrically connected to the second transistor.

BRIEF DESCRIPTION OF THE DRAWINGS

The disclosure can be fully understood by reading the subsequent detailed description and examples with references made to the accompanying drawings, wherein.

DETAILED DESCRIPTION OF THE DISCLOSURE

Figure 1:
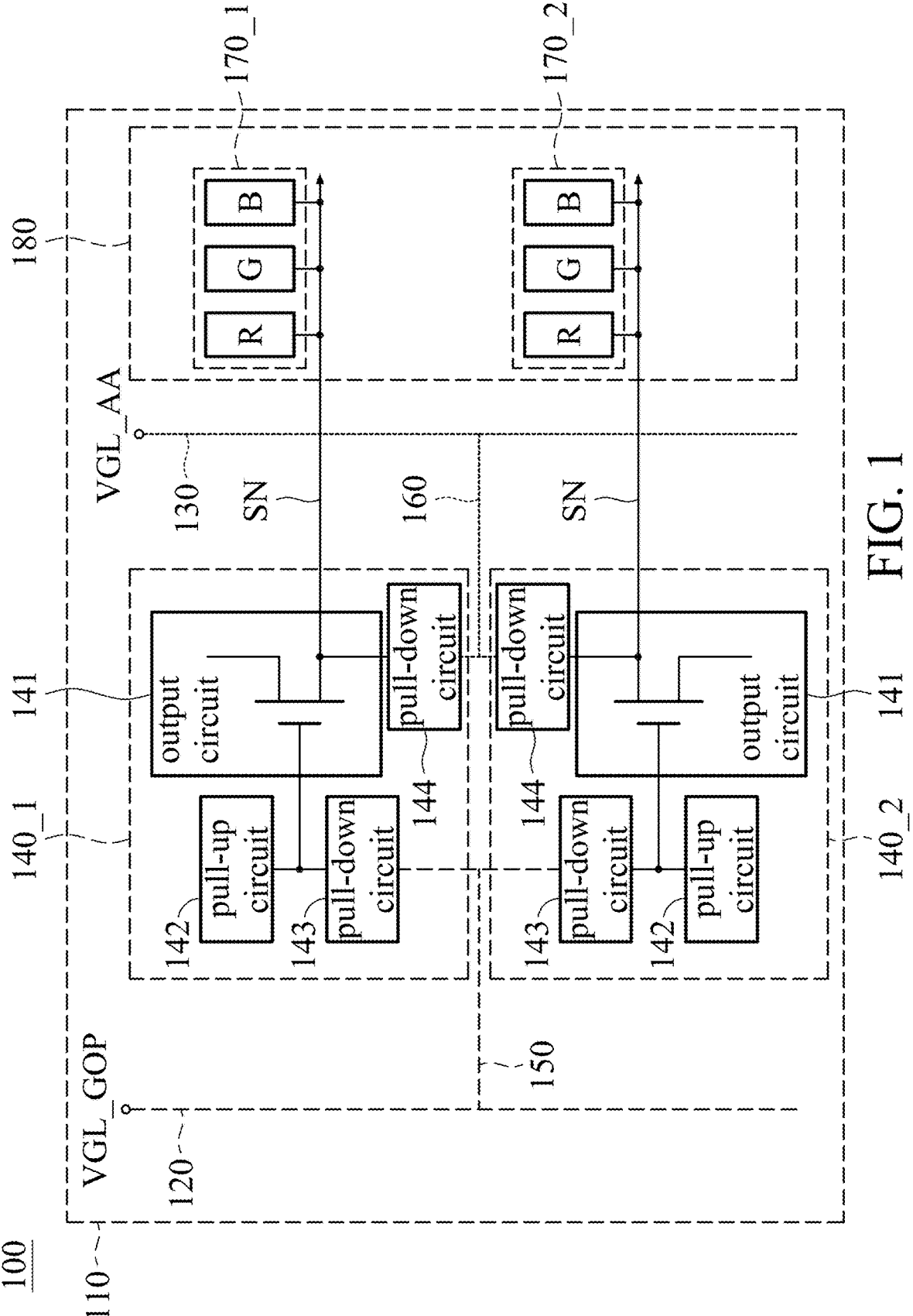
FIG. 1 is a schematic view of an electronic device according to an embodiment of the disclosure.

In order to make objects, features and advantages of the disclosure more obvious and easily understood, the embodiments are described below, and the detailed description is made in conjunction with the drawings. In order to help the reader to understand the drawings, the multiple drawings in the disclosure may depict a part of the entire device, and the specific components in the drawing are not drawn to scale.

The specification of the disclosure provides various embodiments to illustrate the technical features of the various embodiments of the disclosure. The configuration, quantity, and size of each component in the embodiments are for illustrative purposes, and are not intended to limit the disclosure. In addition, if the reference number of a component in the embodiments and the drawings appears repeatedly, it is for the purpose of simplifying the description, and does not mean to imply a relationship between different embodiments.

Furthermore, use of ordinal terms such as "first", "second", etc., in the specification and the claims to describe a claim element does not by itself connote and represent the claim element having any previous ordinal term, and does not represent the order of one claim element over another or the order of the manufacturing method, either. The ordinal terms are used as labels to distinguish one claim element having a certain name from another element having the same name.

In the disclosure, the technical features of the various embodiments may be replaced or combined with each other to complete other embodiments without being mutually exclusive.

In some embodiments of the disclosure, unless specifically defined, the term "coupled" may include any direct and indirect means of electrical connection.

In the text, the terms "substantially" or "approximately" usually means within 20%, or within 10%, or within 5%, or within 3%, or within 2%, or within 1%, or within 0.5% of a given value or range. The quantity given here is an approximate quantity. That is, without the specific description of "substantially" or "approximately", the meaning of "substantially" or "approximately" may still be implied.

The "including" mentioned in the entire specification and claims is an open term, so it should be interpreted as "including or comprising but not limited to".

Furthermore, "connected or "coupled" herein includes any direct and indirect connection means. Therefore, an element or layer is referred to as being "connected to" or "coupled to" another element or layer, the element or layer can be directly on, connected or coupled to another element or layer or intervening elements or layers may be present. When an element is referred to as being "directly connected to" or "directly coupled to" another element or layer, there are no intervening elements or layers present. If the text describes that a first device on a circuit is coupled to a second device, it indicates that the first device may be directly electrically connected to the second device. When the first device is directly electrically connected to the second device, the first device and the second device are connected through conductive lines or passive elements (such as resistors, capacitors, etc.), and no other electronic elements are connected between the first device and the second device.

In an embodiment, the electronic device may include a display device, a backlight device, an antenna device, a sensing device, a splicing device or a therapeutic diagnosis device, but the disclosure is not limited thereto. The electronic device may be a bendable or flexible electronic device. The display device may be a non-self-luminous type display device or a self-luminous type display device. The antenna device may be a liquid-crystal type antenna device or a non-liquid-crystal type antenna device, and the sensing device may be a sensing device that senses capacitance, light, heat or ultrasound, but the disclosure is not limited thereto. The electronic component may include a passive component and an active component, such as a capacitor, a resistor, an inductor, a diode, a transistor, etc. The diode may include a light-emitting diode or a photodiode. The light-emitting diode may include, for example, an organic light-emitting diode (OLED), a mini LED, a micro LED or a quantum dot LED, but the disclosure is not limited thereto. The splicing device may be, for example, a display splicing device or an antenna splicing device, but the disclosure is not limited thereto. It should be noted that the electronic device may be any arrangement and combination of the above devices, but the disclosure is not limited thereto. Hereinafter, the display device will be used as an electronic device to illustrate to the content of the disclosure, but the disclosure is not limited thereto.

FIG. 1 is a schematic view of an electronic device according to an embodiment of the disclosure. Please refer to FIG. 1. The electronic device 100 may at least include a substrate 110, a bus line 120, a bus line 130, a driving unit 140_1, a driving unit 140_2, a signal line 150 and a signal line 160.

In some embodiments, the substrate 110 may include a rigid substrate or a flexible substrate, and the material of the substrate 110 may include glass, quartz, sapphire, ceramics, polycarbonate (PC), polyimide, (PI), polyethylene tereph-thalate (PET), other suitable materials or a combination thereof, but the disclosure is not limited thereto.

The bus line 120 may be disposed on the substrate 110 and configured to output a signal VGL_GOP. The bus line 130 may be disposed on the substrate 110 and configured to output a signal VGL_AA.

The driving unit 140_1 and the driving unit 140_2 may be disposed on the substrate 110. The driving unit 140_1 and the driving unit 140_2 are disposed between the bus line 120 and the bus line 130, and the driving unit 140_1 and the driving unit 140_2 may be disposed adjacent to each other. For example, the driving unit 140_1 may be an Nth stage circuit, and the driving unit 140_2 may be an (N+1)th stage circuit, but the disclosure is not limited thereto. In the embodiment, each of the driving unit 140_1 and the driving unit 140_2 may be a gate-on-panel (GOP) driving circuit, but the disclosure is not limited thereto. In addition, each of the driving unit 140_1 and the driving unit 140_2 may include an output circuit 141, a pull-up circuit 142, a pull-down circuit 143 and a pull-down circuit 144. The output circuit 141 may be configured to output a scan signal SN. The pull-up circuit 142 may be electrically connected to the output circuit 141. The pull-down circuit 143 may be electrically connected to the pull-up circuit 142 and the output circuit 141. The pull-down circuit 144 may be electrically connected to the pull-up circuit 142.

The signal line 150 may be disposed on the substrate 110. The signal line 150 may be electrically connected to the bus line 120 and configured to transmit the signal VGL_GOP to the driving unit 140_1 and the driving unit 140_2, i.e., the driving unit 140_1 and the driving unit 140_2 may be electrically connected to the signal line 150 and share the signal line 150. The signal line 160 may be disposed on the substrate 110. The signal line 160 may be electrically connected to the bus line 130 and configured to transmit the signal VGL_AA to at least one of the driving unit 140_1 and the driving unit 140_2 (such as the driving unit 140_1), i.e., the driving unit 140_1 may be electrically connected to the signal line. Therefore, the driving unit 140_1 and the driving unit 140_2 may share the signal line 150, so as to effectively reduce the layout space of the electronic device 100, or avoid signal differences caused by different trace distances of the signal lines.

In some embodiments, the signal line 160 may further be configured to transmit the signal VGL_AA to the driving unit 140_1 and the driving unit 140_2, i.e., the driving unit 140_1 and the driving unit 140_2 may be electrically connected to the signal line 160 and share the signal line 160. Therefore, the driving unit 140_1 and the driving unit 140_2 may not only share the signal line 150, but also share the signal line 160, so as to effectively reduce the lay space of the electronic device 100 (for example, reduce a border size of the electronic device 100), or avoid signal differences caused by different trace distances of the signal lines.

The electronic device 100 further include a pixel circuit 170_1 and a pixel circuit 170_2. In the embodiment, the pixel circuit 170_1 and the pixel circuit 170_2 may be located in an active area (AA) 180. The pixel circuit 170_1 may be electrically connected to the driving unit 140_1, so that the driving unit 140_1 may output the scan signal SN to the pixel circuit 170_1. The pixel circuit 170_2 may be electrically connected to the driving unit 140_2, so that the driving unit 140_2 may output the scan signal SN to the pixel circuit 170_2. In addition, each of the pixel circuit 170_1 and the pixel circuit 170_2 may include a red pixel unit R, a green pixel unit G and a blue pixel unit B, but the disclosure is not limited thereto.

In the embodiment, the number of the driving unit 140_1 and the driving unit 140_2 is two, but the disclosure is not limited thereto. In other embodiments, the number of driving units may be greater than two, the disposing of the driving units and coupling relationship thereof may refer to the description of the above embodiment, and the description thereof is not repeated herein. In addition, when the number of driving units increases, the number of pixel circuits may also increase.

Figure 2:
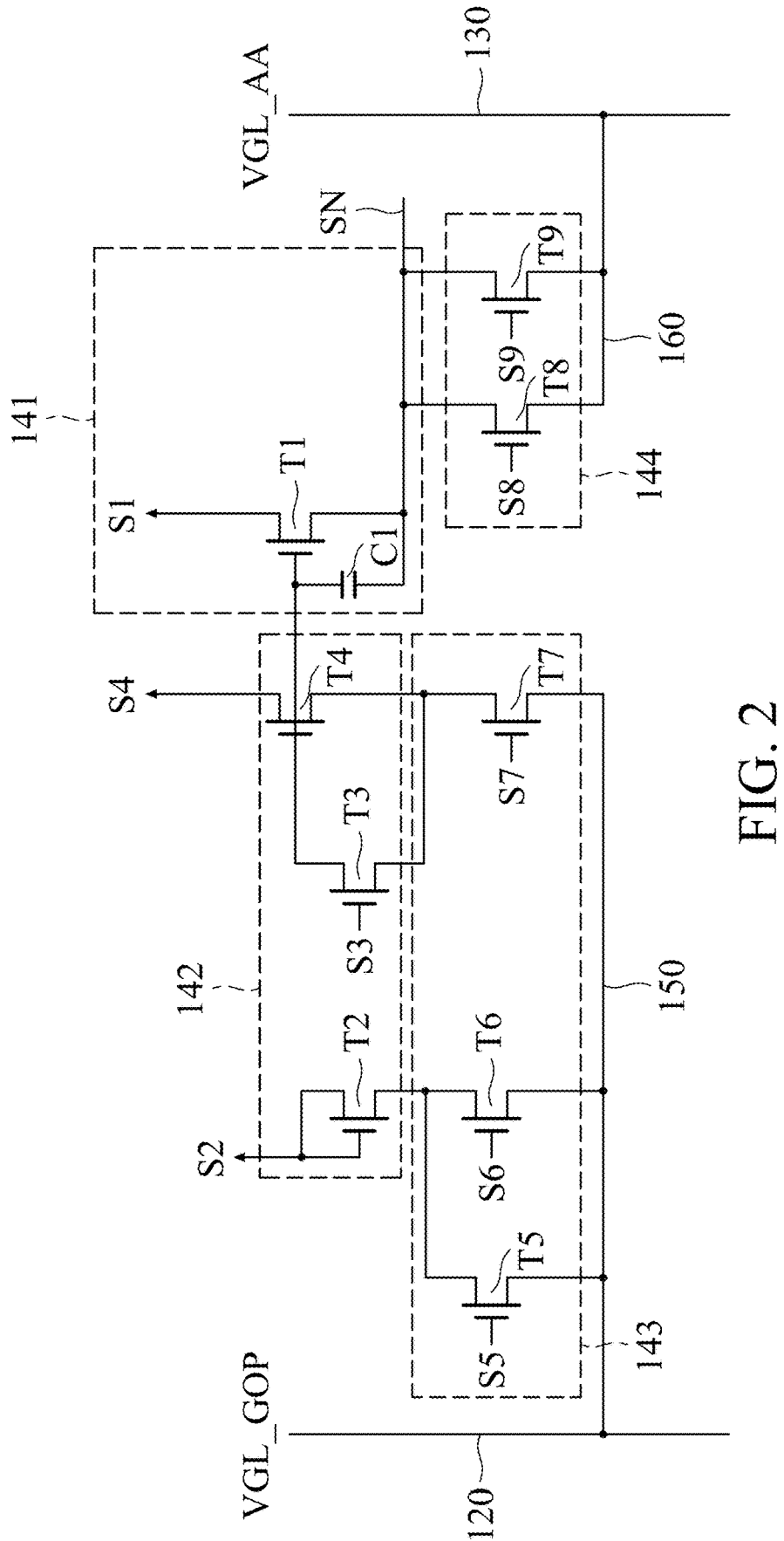
FIG. 2 is a circuit diagram of a driving unit in FIG. 1.

FIG. 2 is a circuit diagram of a driving unit in FIG. 1. The driving circuit of the embodiment may correspond to the driving unit 140_1 or the driving unit 140_2 in FIG. 1. It should be noted that the circuit of the driving unit shown in FIG. 2 is an example, but the disclosure is not limited thereto, and the design of the driving unit may be changed according the requirements. Please refer to FIG. 2. The output circuit 141 may include a transistor T1. The transistor T1 has a first terminal, a second terminal and a control terminal. The first terminal of the transistor T1 receives a signal S1. The second terminal of the transistor T1 is electrically connected to the pull-down circuit 144 and outputs the scan signal SN. The control terminal of the transistor T1 is electrically connected to the pull-up circuit 142. In addition, the output circuit 141 further includes a capacitor C1. The capacitor C1 has a first terminal and a second terminal. The first terminal of the capacitor C1 is electrically connected to the control terminal of the transistor T1. The second terminal of the capacitor C1 is electrically connected to the second terminal of the transistor T1, but the disclosure is not limited thereto.

The pull-up circuit 142 includes a transistor T2, a transistor T3 and a transistor T4. The transistor T2 has a first terminal, a second terminal and a control terminal. The first terminal of the transistor T2 receives a signal S2. The second terminal of the transistor T2 is electrically connected to the pull-down circuit 143. The control terminal of the transistor T2 is electrically connected to the first terminal of the transistor T2. The transistor T3 has a first terminal, a second terminal and a control terminal. The control terminal of the transistor T3 receives a signal S3. The transistor T4 has a first terminal, a second terminal and a control terminal. The first terminal of the transistor T4 receives a signal S4. The second terminal of the transistor T4 is electrically connected to the second terminal of the transistor T3. The control terminal of the transistor T4 is electrically connected to the first terminal of the transistor T3, the second terminal of the transistor T2 and the output circuit 141 (such as the control terminal of the transistor T1).

The pull-down circuit 143 includes a transistor T5, a transistor T6 and a transistor T7. The transistor T5 has a first terminal, a second terminal and a control terminal. The first terminal of the transistor T5 is electrically connected to the pull-up circuit 142 (such the second terminal of the transistor T2). The second terminal of the transistor T5 is electrically connected to the signal line 150, so that the signal line 150 may transmit the signal VGL_GOP to the second terminal of the transistor T5 (in other words, when the driving unit 140_1 and the driving unit 140_2 share the signal line 150, the signal line 150 may transmit the signal VGL_GOP to the transistor T5 of each of the driving unit 140_1 and the driving unit 140_2). The control terminal of the transistor T5 receives a signal S5. The transistor T6 has a first terminal, a second terminal and a control terminal. The first terminal of the transistor T6 is electrically connected to the first terminal of the transistor T5. The second terminal of the transistor T6 is electrically connected to the second terminal of the transistor T5. The control terminal of the transistor T6 receives a signal S6. The transistor T7 has a first terminal, a second terminal and a control terminal. The first terminal of the transistor T7 is electrically connected to the pull-up circuit 142 (such as the second terminal of the transistor T4). The second terminal of the transistor T7 is electrically connected to the second terminal of the transistor T6. The control terminal of the transistor T7 receives a signal S7.

The pull-down circuit 144 may include a transistor T8 and a transistor T9. The transistor T8 has a first terminal, a second terminal and a control terminal. The first terminal of the transistor T8 is electrically connected to the output circuit 141 (such as the second terminal of the transistor T1). The second terminal of the transistor T8 is electrically connected to the signal line 160, so that the signal line 160 may transmit the signal VGL_AA to the second terminal of the transistor T8 (in other words, when one of the driving unit 140_1 and the driving unit 140_2 is coupled to the signal line 160, the signal line 160 may transmit the signal VGL_GOP to the one of the driving unit 140_1 and the driving unit 140_2 coupled to the signal line 160). The control terminal of the transistor T8 receives a signal S8. The transistor T9 has a first terminal, a second terminal and a control terminal. The first terminal of the transistor T9 is electrically connected to the first terminal of the transistor T8. The second terminal of the transistor T9 is electrically connected to the second terminal of the transistor T8. The control terminal of the transistor T9 receives a signal S9. It should be noted that in FIG. 1 and FIG. 2, the signal VGL_GOP is related to the operation of the driving unit 140_1 and/or the driving unit 140_2, and the signal VGL_AA may be used to change the voltage level of the scan signal SN output from the driving unit 140_1 and/or the driving unit 140_2 to the pixel circuit 170_1 and/or the pixel circuit 170_2. However, in the disclosure, the type of the signal connected to the driving unit is not limited thereto.

In the embodiment, each of the transistor T1 to the transistor T9 may be an N-type transistor. The first terminals of the first transistor T1 to the transistor T9 may be, for example, a drain terminal of the N-type transistor. The second terminals of the transistor T1 to the transistor T9 may be, for example, a source terminal of the N-type transistor. The control terminals of the transistor T1 to the transistor T9 may be, for example, a gate terminal of the N-type transistor. In some embodiments, each of the transistor T1 to the transistor T9 may be a P-type transistor or another suitable transistor, but the disclosure is not limited thereto.

Figure 3:
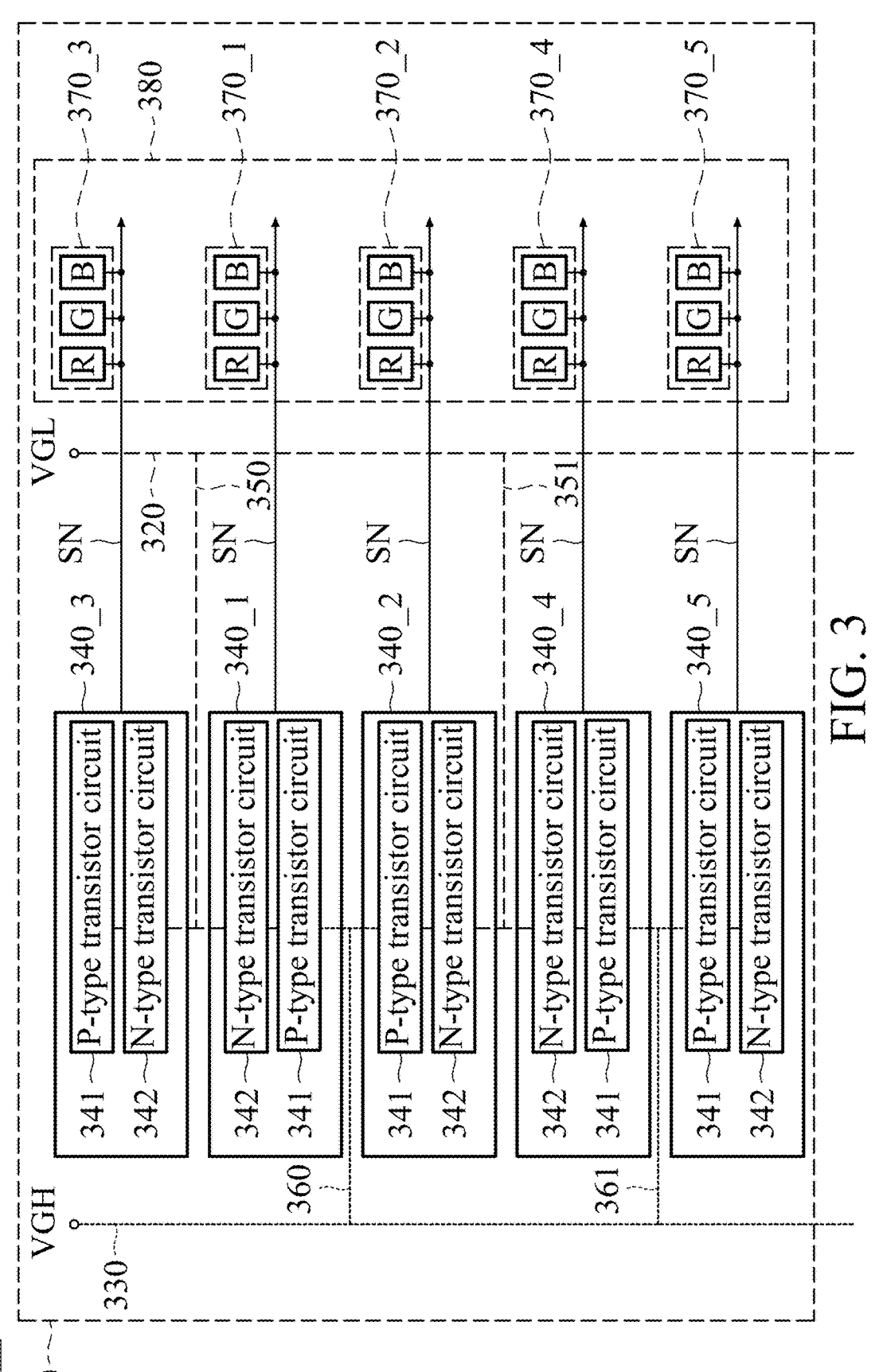
FIG. 3 is a schematic view of an electronic device according to another embodiment of the disclosure.

FIG. 3 is a schematic view of an electronic device according to another embodiment of the disclosure. Please refer to FIG. 3. The electronic device 300 may at least include a substrate 310, a bus line 320, a bus line 330, a driving unit 340_1, a driving unit 340_2, a driving unit 340_3, a driving unit 340_4, a driving unit 340_5, a signal line 350, a signal line 351, a signal line 360 and signal line 361.

In some embodiments, the substrate 310 may include a rigid substrate or a flexible substrate, and the material of the substrate 310 may include glass, quartz, sapphire, ceramics, polycarbonate (PC), polyimide, (PI), polyethylene terephthalate (PET), other suitable materials or a combination thereof, but the disclosure is not limited thereto. The bus line 320 may be disposed on the substrate 310 and configured to output a signal VGL. The bus line 330 may be disposed on the substrate 310 and configured to output a signal VGH.

The driving unit 340_1, the driving unit 340_2, the driving unit 340_3, the driving unit 340_4 and the driving unit 340_5 may be disposed on the substrate 310. The driving unit 340_1, the driving unit 340_2, the driving unit 340_3, the driving unit 340_4 and the driving unit 340_5 are disposed between the bus line 320 and the bus line 330, and the driving unit 340_1, the driving unit 340_2, the driving unit 340_3, the driving unit 340_4 and the driving unit 340_5 may be disposed adjacent to each other.

In addition, the driving unit 340_1 may be disposed between the driving unit 340_2 and the driving unit 340_3, the driving unit 340_2 may be disposed between the driving unit 340_1 and the driving unit 340_4, and the driving unit 340_4 may be disposed between the driving unit 340_2 and the driving unit 340_5. In some embodiments, the driving unit 340_3 may be an (N−2)th stage circuit, the driving unit 340_1 may be an (N−1)th stage circuit, the driving unit 340_2 may be an Nth stage circuit, the driving unit 340_4 may be an (N+1)th stage circuit, and the driving unit 340_5 may be an (N+2)th stage circuit, but the disclosure is not limited thereto.

In the embodiment, each of the driving unit 340_1, the driving unit 340_2, the driving unit 340_3, the driving unit 340_4 and the driving unit 340_5 may be a gate-on-panel (GOP) driving circuit, but the disclosure is not limited thereto. In addition, each of the driving unit 340_1, the driving unit 340_2, the driving unit 340_3, the driving unit 340_4 and the driving unit 340_5 may include a complementary metal oxide semiconductor (CMOS) digital circuit, but the disclosure is not limited thereto. Furthermore, each of the driving unit 340_1, the driving unit 340_2, the driving unit 340_3, the driving unit 340_4 and the driving unit 340_5 may include a P-type transistor circuit 341 and an N-type transistor circuit 342. The P-type transistor circuit 341 may be electrically connected to the N-type transistor circuit 342, but the type and the connection manner of the transistor circuit of the disclosure may be not limited to those shown in FIG. 3.

The signal line 350 may be disposed on the substrate 310. The signal line 350 may be electrically connected to the bus line 320 and configured to transmit the signal VGL to the driving unit 340_1 and the driving unit 340_3, i.e., the driving unit 340_1 and the driving unit 340_3 may be electrically connected to the signal line 350 and share the signal line 350 (for example, the N-type transistor circuit 342 of the driving unit 340_1 and the N-type transistor circuit 342 of the driving unit 340_3 may be electrically connected to the signal line 350 and share the signal line 350). The signal line 351 may be disposed on the substrate 310. The signal line 351 may be electrically connected to the bus line 320 and configured to transmit the signal VGL to the driving unit 340_2 and the driving unit 340_4 i.e., the driving unit 340_2 and the driving unit 340_4 may be electrically connected to the signal line 351 and share the signal line 351 (for example, the N-type transistor circuit 342 of the driving unit 340_2 and the N-type transistor circuit 342 of the driving unit 340_4 may be electrically connected to the signal line 351 and share the signal line 351).

The signal line 360 may be disposed on the substrate 310. The signal line 360 may be electrically connected to the bus line 330 and configured to transmit the signal VGH to the driving unit 340_1 and the driving unit 340_2 i.e., the driving unit 340_1 and the driving unit 340_2 may be electrically connected to the signal line 360 and share the signal line 360 (for example, the P-type transistor circuit 341 of the driving unit 340_1 and the P-type transistor circuit 341 of the driving unit 340_2 may be electrically connected to the signal line 360 and share the signal line 360). The signal line 361 may be disposed on the substrate 310. The signal line 361 may be electrically connected to the bus line 330 and configured to transmit the signal VGH to the driving unit 340_4 and the driving unit 340_5 i.e., the driving unit 340_4 and the driving unit 340_5 may be electrically connected to the signal line 361 and share the signal line 361 (for example, the P-type transistor circuit 341 of the driving unit 340_4 and the P-type transistor circuit of the driving unit 340_5 may be electrically connected to the signal line 361 and share the signal line 361). It should be noted that in FIG. 3 and FIG. 4, the signal VGL and the signal VGH are related to the operation of at least one of the driving unit 340_1 to the driving unit 340_5. In the embodiment, the voltage level of the signal VGL is, for example, less than the voltage level of the signal VGH. However, in the disclosure, the type of the signal connected to the driving unit is not limited thereto.

Therefore, the driving unit 340_1 and the driving unit 340_3 may share the signal line 350, the driving unit 340_1 and the driving unit 340_2 may share the signal line 360, the driving unit 340_2 and the driving unit 340_4 may share the signal line 351, and the driving unit 340_4 and the driving unit 340_5 may share the signal line 361, so as to effectively reduce the layout space of the electronic device 300 (for example, reduce a border size of the electronic device 300), or avoid signal differences caused by different trace distances of the signal lines.

The electronic device 300 further include a pixel circuit 370_1, a pixel circuit 370_2, a pixel circuit 370_3, a pixel circuit 370_4 and a pixel circuit 370_5. In the embodiment, the pixel circuit 370_1, the pixel circuit 370_2, the pixel circuit 370_3, the pixel circuit 370_4 and the pixel circuit 370_5 may be located in an active area 380. The pixel circuit 370_1 may be electrically connected to the driving unit 340_1, so that the driving unit 340_1 may output the scan signal SN to the pixel circuit 370_1. The pixel circuit 370_2 may be electrically connected to the driving unit 340_2, so that the driving unit 340_2 may output the scan signal SN to the pixel circuit 370_2. The pixel circuit 370_3 may be electrically connected to the driving unit 340_3, so that the driving unit 340_3 may output the scan signal SN to the pixel circuit 370_3.

The pixel circuit 370_4 may be electrically connected to the driving unit 340_4, so that the driving unit 340_4 may output the scan signal SN to the pixel circuit 370_4. The pixel circuit 370_5 may be electrically connected to the driving unit 340_5, so that the driving unit 340_5 may output the scan signal SN to the pixel circuit 370_5. In addition, each of the pixel circuit 370_1, the pixel circuit 370_2, the pixel circuit 370_3, the pixel circuit 370_4 and the pixel circuit 370_5 may include a red pixel unit R, a green pixel unit G and a blue pixel unit B, but the disclosure is not limited thereto.

In the embodiment, the number of the driving unit 340_1, the driving unit 340_2, the driving unit 340_3, the driving unit 340_4 and the driving unit 340_5 is five, but the disclosure is not limited thereto. In other embodiments, the number of driving units may be greater than three, the disposing of the driving units and coupling relationship thereof may refer to the description of the above embodiment, and the description thereof is not repeated herein. In addition, when the number of driving units increases, the number of pixel circuits may also increase.

Figure 4:
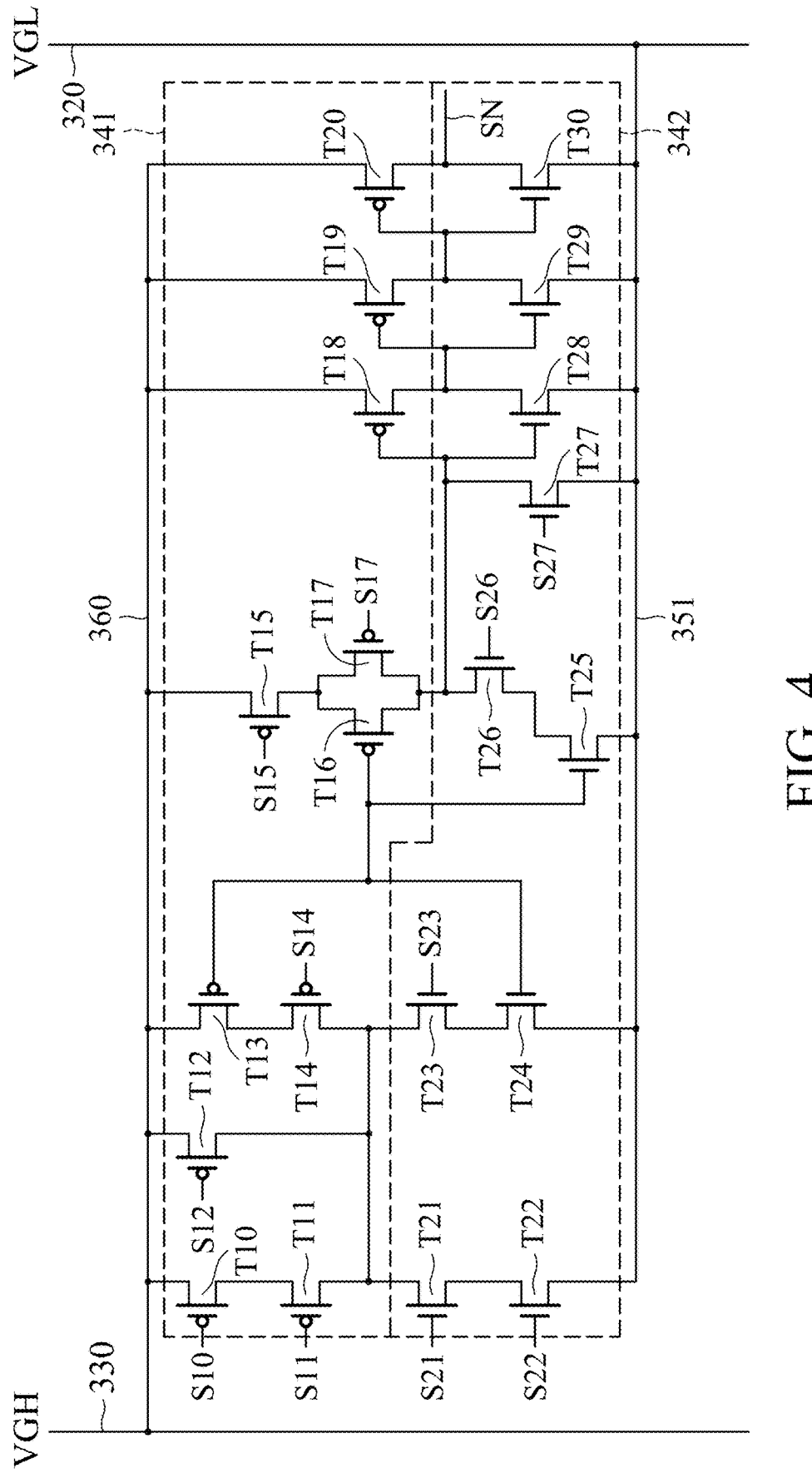
FIG. 4 is a circuit diagram of a driving unit in FIG. 3.

FIG. 4 is a circuit diagram of a driving unit in FIG. 3. More specifically, FIG. 4 is a circuit diagram of the driving unit 340_2 as an example. However, the driving unit shown in FIG. 4 may also correspond to the driving unit 340_1, the driving unit 340_3, the driving 340_4 and the driving unit 340_5 in FIG. 3. Please refer to FIG. 4. The P-type transistor circuit 341 may include a transistor T10 to a transistor T20. It should be noted that the circuit of the driving unit shown in FIG. 4 but the disclosure is not limited thereto, and the design of the driving unit may be changed according the requirements.

The transistor T10 has a first terminal, a second terminal and a control terminal. The first terminal of the transistor T10 receives a signal VGH. In some embodiments, the transistors T10 of the driving unit 340_1 and the driving unit 340_2 may be electrically connected to the signal line 360, so that the signal line 360 may transmit the signal VGH to the first terminals of the transistors T10, and the transistors T10 of the driving unit 340_4 and the driving unit 340_5 may be electrically connected to the signal line 361, so that the signal line 361 may transmit the signal VGH to the first terminals of the transistors T10. The control terminal of the transistor T10 receives a signal S10. The transistor T11 has a first terminal, a second terminal and a control terminal. The first terminal of the transistor T11 is electrically connected to the second terminal of the transistor T10. The control terminal of the transistor T11 receives a signal S11.

The transistor T12 has a first terminal, a second terminal and a control terminal. The first terminal of the transistor T12 is electrically connected to the first terminal of the transistor T10. The second terminal of the transistor T12 is electrically connected to the second terminal of the transistor T11. The control terminal of the transistor T12 receives a signal S12. The transistor T13 has a first terminal, a second terminal and a control terminal. The first terminal of the transistor T13 is electrically connected to the first terminal of the transistor T10. The transistor T14 has a first terminal, a second terminal and a control terminal. The first terminal of the transistor T14 is electrically connected to the second terminal of the transistor T13. The second terminal of the transistor T14 is electrically connected to the second terminal of the transistor T11. The control terminal of the transistor T14 receives a signal S14.

The transistor T15 has a first terminal, a second terminal and a control terminal. The first terminal of the transistor T15 is electrically connected to the first terminal of the transistor T10. The control terminal of the transistor T15 receives a signal S15. The transistor T16 has a first terminal, a second terminal and a control terminal. The first terminal of the transistor T16 is electrically connected to the second terminal of the transistor T15. The control terminal of the transistor T16 is electrically connected to the control terminal of the transistor T13.

The transistor T17 has a first terminal, a second terminal and a control terminal. The first terminal of the transistor T17 is electrically connected to the second terminal of the transistor T15. The second terminal of the transistor T17 is electrically connected to the second terminal of the transistor T16. The control terminal of the transistor T17 receives a signal S17. The transistor T18 has a first terminal, a second terminal and a control terminal. The first terminal of the transistor T18 is electrically connected to the first terminal of the transistor T10. The control terminal of the transistor T18 is electrically connected to the second terminal of the transistor T16.

The transistor T19 has a first terminal, a second terminal and a control terminal. The first terminal of the transistor T19 is electrically connected to the first terminal of the transistor T10. The control terminal of the transistor T19 is electrically connected to the second terminal of the transistor T18. The transistor T20 has a first terminal, a second terminal and a control terminal. The first terminal of the transistor T20 is electrically connected to the first terminal of the transistor T10. The second terminal of the transistor T20 outputs the scan signal SN. The control terminal of the transistor T20 is electrically connected to the second terminal of the transistor T19.

In the embodiment, each of the transistor T10 to the transistor T20 may be a P-type transistor. The first terminal of each of the first transistor T10 to the transistor T20 may be, for example, a source terminal of the P-type transistor. The second terminal of each of the transistor T10 to the transistor T20 may be, for example, a drain terminal of the P-type transistor. The control terminal of each of the transistor T10 to the transistor T20 may be, for example, a gate terminal of the P-type transistor. It should be noted that in the disclosure, the number of transistors, the definition of each terminal and the connection of each terminal of the P-type transistor circuit 341 may be changed as required, and are not limited to those shown in FIG. 4.

The N-type transistor circuit 342 may include a transistor T21 to a transistor T30.

The transistor T21 has a first terminal, a second terminal and a control terminal. The first terminal of the transistor T21 is electrically connected to the second terminal of the transistor T11 of the P-type transistor circuit 341. The control terminal of the transistor T21 receives a signal S21. The transistor T22 has a first terminal, a second terminal and a control terminal. The first terminal of the transistor T22 is electrically connected to the second terminal of the transistor T21. The second terminal of the transistor T22 may receive the signal VGL. In some embodiments, the transistors T22 of the driving unit 340_2 and the driving unit 340_4 may be electrically connected to the signal line 351, so that the signal line 350 may transmit the signal VGL to the second terminals of the transistors T22, and the transistors T22 of the driving unit 340_3 and the driving unit 340_1 may be electrically connected to the signal line 350, so that the signal line 350 may transmit the signal VGL to the second terminals of the transistors T22. The control terminal of the transistor T22 receives a signal S22.

The transistor T23 has a first terminal, a second terminal and a control terminal. The first terminal of the transistor T23 is electrically connected to the first terminal of the transistor T21. The control terminal of the transistor T23 receives a signal S23. The transistor T24 has a first terminal, a second terminal and a control terminal. The first terminal of the transistor T24 is electrically connected to the second terminal of the transistor T23. The second terminal of the transistor T24 is electrically connected to the second terminal of the transistor T22. The control terminal of the transistor T24 is electrically connected to the control terminals of the transistor T13 and the transistor T16 of the P-type transistor circuit 341.

The transistor T25 has a first terminal, a second terminal and a control terminal. The second terminal of the transistor T25 is electrically connected to the second terminal of the transistor T22. The control terminal of the transistor T25 is electrically connected to the control terminal of the transistor T24 and the control terminals of the transistor T13 and the transistor T16 of the P-type transistor circuit 341. The transistor T26 has a first terminal, a second terminal and a control terminal. The first terminal of the transistor T26 is electrically connected to the second terminals of the transistor T16 and the transistor T17 of the P-type transistor circuit 341. The second terminal of the transistor T26 is electrically connected to the first terminal of the transistor T25. The control terminal of the transistor T26 receives a signal S26.

The transistor T27 has a first terminal, a second terminal and a control terminal. The first terminal of the transistor T27 is electrically connected to the first terminal of the transistor T26 and the control terminal of the transistor T18 of the P-type transistor circuit 341. The second terminal of the transistor T27 is electrically connected to the second terminal of the transistor T22. The control terminal of the transistor T27 receives a signal S27. The transistor T28 has a first terminal, a second terminal and a control terminal. The first terminal of the transistor T28 is electrically connected to the second terminal of the transistor T18 of the P-type transistor circuit 341. The second terminal of the transistor T28 is electrically connected to the second terminal of the transistor T22. The control terminal of the transistor T28 is electrically connected to the first terminals of the transistor T26 and the transistor T27.

The transistor T29 has a first terminal, a second terminal and a control terminal. The first terminal of the transistor T29 is electrically connected to the second terminal of the transistor T19 of the P-type transistor circuit 341. The second terminal of the transistor T29 is electrically connected to the second terminal of the transistor T22. The control terminal of the transistor T29 is electrically connected to the first terminal of the transistor T28. The transistor T30 has a first terminal, a second terminal and a control terminal. The first terminal of the transistor T30 is electrically connected to the second terminal of the transistor T20 of the P-type transistor circuit 341. The second terminal of the transistor T30 is electrically connected to the second terminal of the transistor T22. The control terminal of the transistor T30 is electrically connected to the first terminal of the transistor T29.

In the embodiment, each of the transistor T21 to the transistor T30 may be an N-type transistor. The first terminal of each of the first transistor T21 to the transistor T30 may be, for example, a drain terminal of the N-type transistor. The second terminal of each of the transistor T21 to the transistor T30 may be, for example, a source terminal of the N-type transistor. The control terminal of each of the transistor T21 to the transistor T30 may be, for example, a gate terminal of the N-type transistor. It should be noted that in the disclosure, the number of transistors, the definition of each terminal and the connection of each terminal of the N-type transistor circuit 342 may be changed as required, and are not limited to those shown in FIG. 4.

Figure 5:
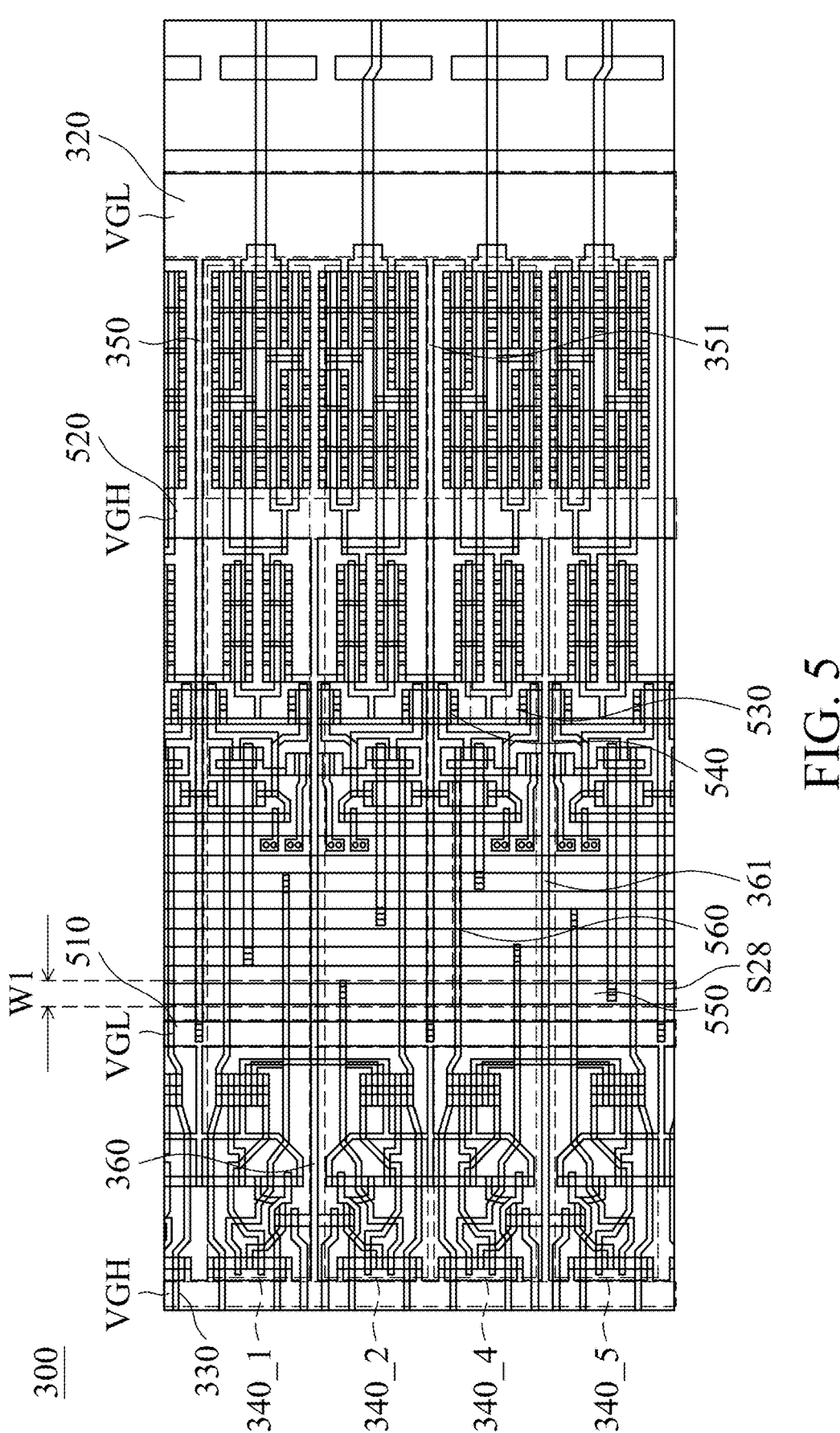
FIG. 5 is a schematic view of a circuit layout of an electronic device according to an embodiment of the disclosure.

FIG. 5 is a schematic view of a circuit layout of an electronic device according to an embodiment of the disclosure. The circuit layout of the embodiment may be similar to the electronic device 300 in FIG. 3. Please refer to FIG. 5. The electronic device 300 further include a bus line 510 and a bus line 520. The bus line 320 and the bus line 510 may output the signal VGL, the signal line 350 may be electrically connected to the bus line 510 and transmit the signal VGL to the driving unit 340_1, and the signal line 351 may be electrically connected to the bus line 510 and transmit the signal VGL to the driving unit 340_2 and the driving unit 340_4.

The bus line 330 and the bus line 520 may output the signal VGH, the signal line 360 may be electrically connected to the bus line 520 and transmit the signal VGH to the driving unit 340_1 and the driving unit 340_2, and the signal line 361 may be electrically connected to the bus line 520 and transmit the signal VGH to the driving unit 340_4 and the driving unit 340_5. As shown in FIG. 5, the bus line 510 and the bus line 520 cross a corresponding range of at least one of the driving unit 340_1, the driving unit 340_2, the driving unit 340_4 and the driving unit 340_5. That is, it can be seen from a top view that at least one of the driving unit 340_1 to the driving unit 340_5 may be divided into a several sub-regions by the bus line 510 and the bus line 520.

In addition, in the embodiment, the bus line 510 may be located between the bus line 330 and the bus line 520, and the bus line 520 may be located between the bus line 320 and the bus line 510, but the disclosure is not limited thereto. It should be noted that when the bus line that transmits a specific signal is disposed on one side of the driving unit, the transistor in the driving unit that are farther away from the bus line may receive the signal with larger attenuation amplitude due the farther path that transmits the specific signal, and the driving effect of the driving unit is affected. The above phenomenon may be improved by the disposing manner of the bus lines as shown in FIG. 5.

Furthermore, in the embodiment, the transistor 530 of the driving unit 340_4 may receive the signal, and the above transistor 530 may be, for example, one of the transistor T10, the transistor T12, the transistor T13, the transistor T15, the transistor T18, the transistor T19 and the transistor T20 of the driving unit 340_4 in FIG. 4. The transistor 540 of the driving unit 340_4 may receive the signal VGL. The above transistor 540 may be, for example, one of the transistor T22, the transistor T24, the transistor T25, the transistor T27, the transistor T28, the transistor T29 and the transistor T30 of the driving unit 340_4. In addition, the above transistor 540 may be located between the bus line 320 and the bus line 510, and the above transistor 530 may be located between the bus line 330 and the bus line 520, but the disclosure is not limited thereto.

In some embodiments, the signal line 350 and the signal line 351 may have a straight section between the bus line 320 and the bus line 510, and the signal line 360 and the signal line 361 may have a straight section between the bus line 330 and the bus line 520. Therefore, the increasing of the loading of the resistance value of the trace caused by the line bending may be effectively reduced.

In some embodiments, the electronic device 300 further includes a bus line 550 and a signal line 560. The bus line 550 and the signal line 560 may be disposed on the substrate 310. The bus line 550 may be disposed adjacent to one of the bus line 320, the bus line 330, the bus line 510 or bus line 520, but the disclosure is not limited thereto. The extending direction of the bus line 550 may be substantially the same as the extending direction of one of the bus line 320, the bus line 330, the bus line 510 or the bus line 520, but the disclosure is not limited thereto. The bus line 550 may be configured to transmit the signal S28 to the driving unit 340_4 (or one of the driving unit 340_1, the driving unit 340_2, the driving unit 340_3 and the driving unit 340_5), and the signal line 560 may be electrically connected to the bus line 550 and be configured to transmit the signal S28 to the driving unit 340_4 (or one of the driving unit 340_1, the driving unit 340_2, the driving unit 340_3 and the driving unit 340_5).

In the embodiment, the width W1 of the bus line 550 may be, for example, less than the width of each of the bus line 320 (or the bus line 510) and the bus line 330 (or the bus line 520). In addition, the width W1 of the bus line 550 (or the bus line 320, the bus line 330, the bus line 510 or the bus line 520) may be defined as the minimum distance measured in a direction perpendicular to the extending direction of the bus line 550 (or the bus line 320, the bus line 330, the bus line 510 or the bus line 520). For example, the width of the bus line 320 may be, for example, 60 micrometers (μm), the width of the bus line 510 may be, for example, 18 μm, the width of the bus line 330 may be, for example, 18 μm, the width of the bus line 520 may be, for example, 30 μm, and the width W1 of the bus line 550 may be, for example, 15 μm, but the disclosure is not limited thereto. Therefore, by increasing the trace width (i.e., the widths of the bus line 320, the bus line 510, the bus line 330 and the bus line 520), the resistance value may be reduced, or the decay during signal transmission may be improved.

Figure 6:
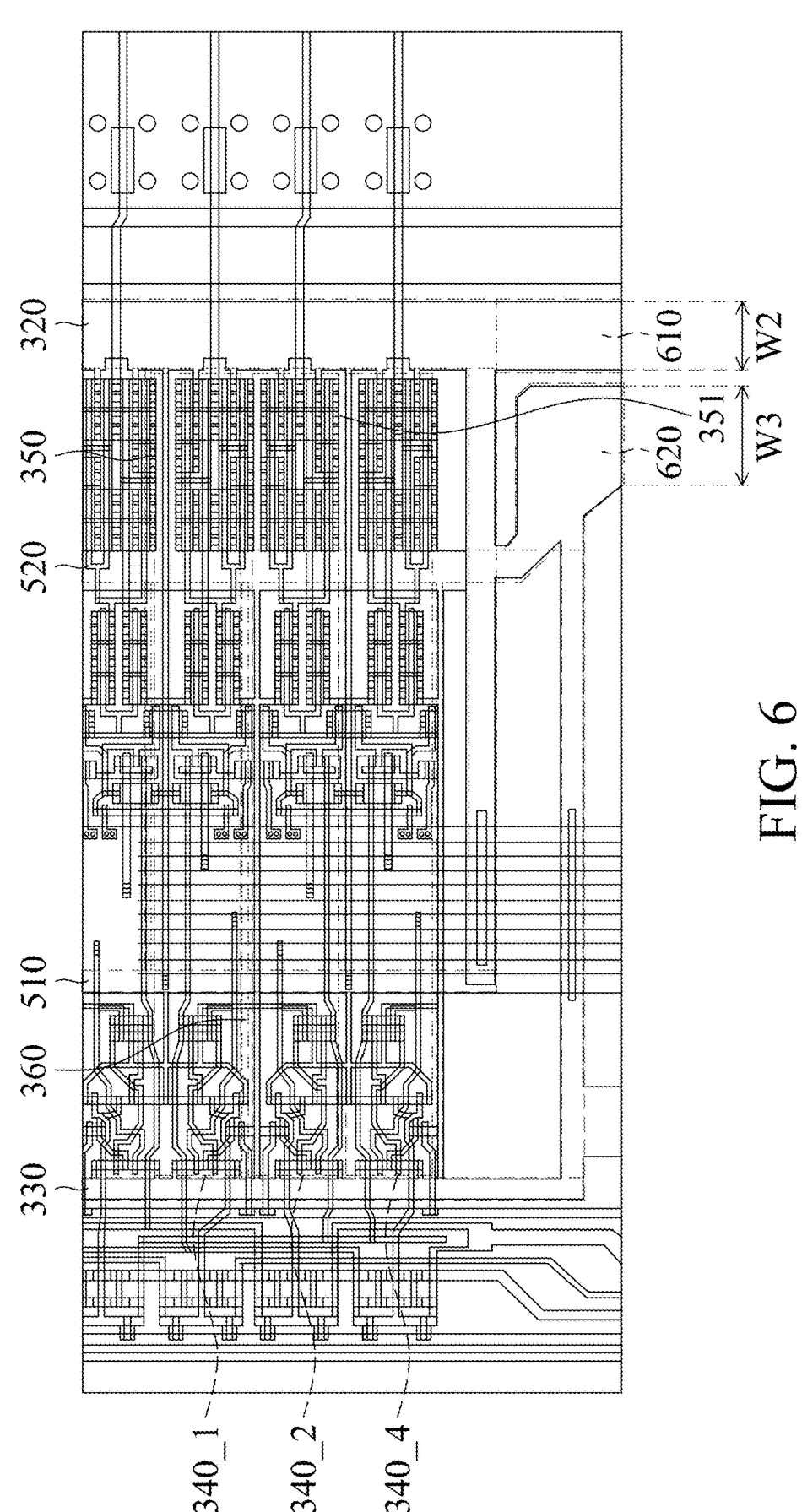
FIG. 6 is a schematic view of a circuit layout of an electronic device according to another embodiment of the disclosure.

FIG. 6 is a schematic view of a circuit layout of an electronic device according to another embodiment of the disclosure. The circuit layout of the embodiment may be similar to the electronic device 300 in FIG. 3. Please refer to FIG. 6. The electronic device 300 includes a bus line 320, a bus line 330, a bus line 510, a bus line 520, a signal line 350, a signal line 351, a signal line 360 and a signal line 361, and the electronic device 300 further includes a trunk line 610 and a trunk line 620.

The trunk line 610 may be electrically connected to the bus line 320 and the bus line 510, and the trunk line 620 may be electrically connected to the bus line 330 and the bus line 520. In the embodiment, the width W2 of the trunk line 610 may be, for example, greater than or equal to the width of at least one of the bus line 320 and the bus line 510, and the width W3 of the trunk line 620 may be, for example, greater than or equal to the width of at least one of the bus line 330 and the bus line 520, but the disclosure is not limited thereto. Similar to the definition of the width of the bus line 320, the bus line 330, the bus line 510 and the bus line 520, in the embodiment, the width W2 of the trunk line 610 and the width W3 of the trunk lime 620 may be defined as the minimum distance measured in a direction perpendicular to the extending direction of the truck line 610 and the trunk line 620. As mentioned above, the travel path of a specific signal is divided into two at the end terminal of the trunk line 610 or the trunk line 620, it may reduce the difference in the strength of the signals received by the transistors in the same stage circuit (i.e., the driving unit 340_1, the driving unit 340_2, the driving unit 340_3, the driving unit 340_4 or the driving unit 340_5) due to different trace distances.

Figure 7:
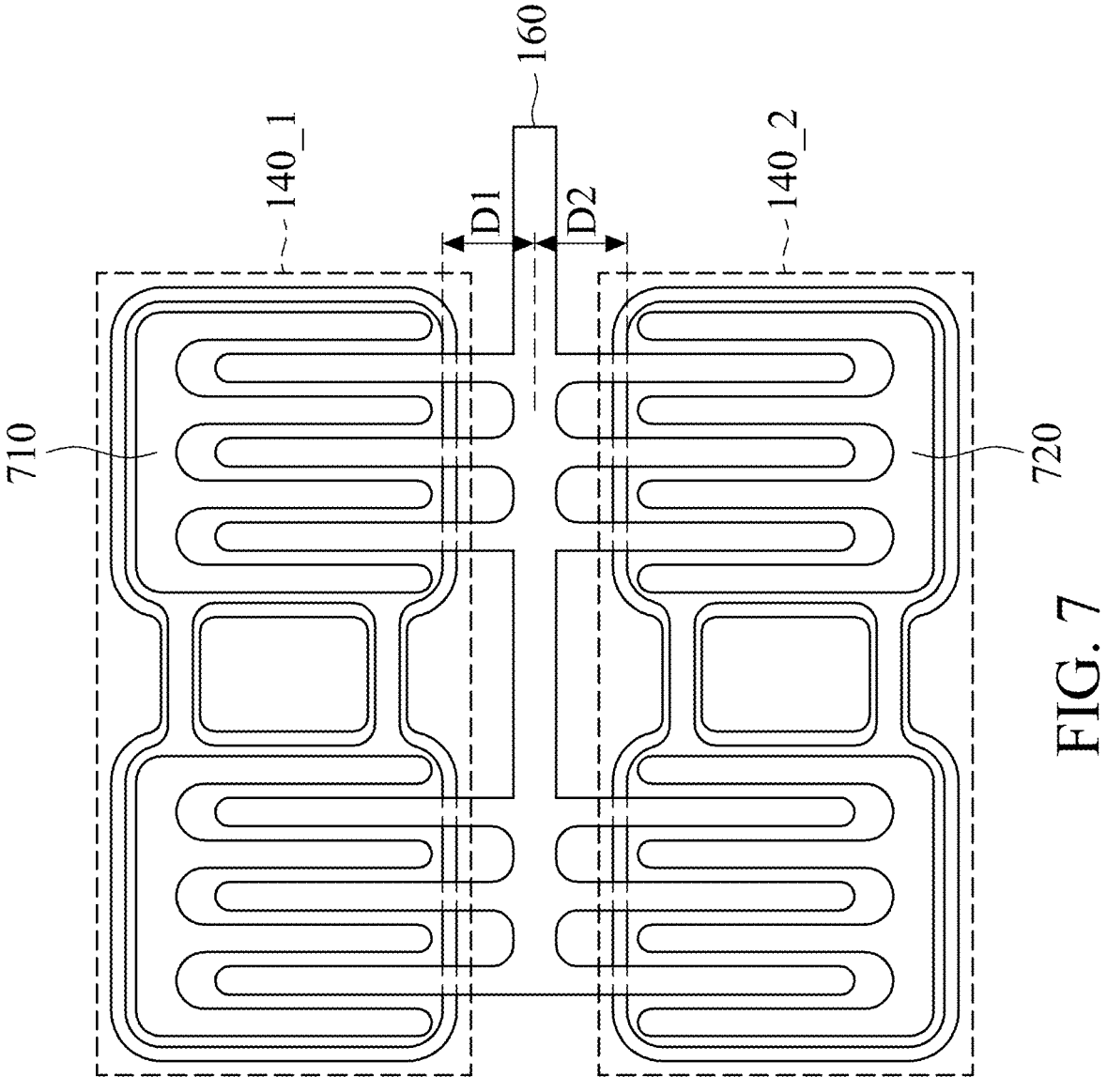
FIG. 7 is a schematic view of a disposing relationship of a driving unit and a signal line according to an embodiment of the disclosure.

FIG. 7 is a schematic view of a disposing relationship of a driving unit and a signal line according to an embodiment of the disclosure. The embodiment in FIG. 7 may correspond to the electronic device 100 in FIG. 1 or the electronic device 300 in FIG. 3. For convenience of description, the driving unit 140_1, the driving unit 140_2 and the signal line 160 in FIG. 1 are taken as an example, but the disclosure is not limited thereto. Please refer to FIG. 7. The driving unit 140_1 may include a transistor 710, and the driving unit 140_2 may include a transistor 720.

In the embodiment, the above transistor 710 is, for example, one of the transistor T8 and the transistor T9 of the pull-down circuit 144 of the driving unit 140_1, and the above transistor 720 is, for example, one of the transistor T8 and the transistor T9 of the pull-down circuit 144 of the driving unit 140_2.

In addition, the transistor 710 of the driving unit 140_1 is spaced apart from the signal line 160 by a distance D1, and the transistor 720 of the driving unit 140_2 is spaced apart from the signal line 160 by a distance D2. More specifically, an edge of a semiconductor layer of the transistor 710 of the driving unit 140_1 is spaced apart from a center point of the signal line 160 by the distance D1, and an edge of a semiconductor layer of the transistor 720 of the driving unit 140_2 is spaced apart from the center point of the signal line 160 by the distance D2. Furthermore, the ratio of the distance D1 to the distance D2 is, for example, in the range from 0.8 to 1.2 (i.e., $0.8 \leq D1/D2 \leq 1.2$), but the disclosure is not limited thereto. Accordingly, the distance from the signal line 160 to the transistor 710 and the transistor 720 is substantially the same. Therefore, since the signal strengths transmitted from the signal line 160 to the driving unit 140_1 and the driving unit 140_2 are not much different, it may reduce the situation that the driving effect of the driving units is different due to the different signal strengths.

Similarly, the disposing of the driving unit 140_1, the driving unit 140_2 and the signal line 150 in FIG. 1, the disposing of the driving unit 340_1, the driving unit 340_3 and the signal line 350 in FIG. 3, the disposing of the driving unit 340_1, the driving unit 340_2 and the signal line 360 in FIG. 3, the disposing of the driving unit 340_2, the driving unit 340_4 and the signal line 351 in FIG. 3 and the disposing of the driving unit 340_4, the driving unit 340_5 and the signal line 361 in FIG. 3 may refer to the description of the above embodiment, and the description thereof is not repeated herein.

In summary, according to the electronic device disclosed by the embodiments of the disclosure, the first driving unit and the second driving unit are disposed between the first bus line and the second bus line, and the first driving unit and the second driving unit are disposed adjacent to each other. The first signal line is electrically connected to the first bus line and transmits the first signal to the first driving unit and the second driving unit. The second signal line is electrically connected to the second bus line and transmits the second signal to at least one of the first driving unit and the second driving unit. Therefore, the layout space of the electronic device may be effectively reduced, or signal differences caused by different trace distances of the signal lines may be effectively avoided.

While the disclosure has been described by way of examples and in terms of the preferred embodiments, it should be understood that the disclosure is not limited to the disclosed embodiments. On the contrary, it is intended to cover various modifications, combinations, and similar arrangements (as would be apparent to those skilled in the art). Therefore, the scope of the appended claims should be accorded the broadest interpretation to encompass all such modifications, combinations, and similar arrangements.

What is claimed is:

1. An electronic device, comprising:
a substrate;
a first driving unit and a second driving unit disposed on the substrate and arranged along a first direction;
a first bus line, disposed on the substrate and extending along the first direction; and
a first signal line, having a main portion, a first branch portion, and a second branch portion, wherein the main portion is electrically connected to the first bus line and extends along a second direction different from the first direction, and the first branch portion and the second branch portion extend from the main portion in opposite direction;
wherein the first driving unit has a first transistor and the second driving unit has a second transistor, the first branch portion of the first signal line is electrically connected to the first transistor, and the second branch portion of the first signal line is electrically connected to the second transistor,
wherein the first transistor is spaced apart from the first signal line by a first distance, the second transistor is spaced apart from the first signal line by a second distance, and a ratio of the first distance to the second distance is in a range of 0.8 to 1.2.

2. The electronic device as claimed in claim 1, wherein the first branch portion and the second branch portion extend from a same center point of the main portion.

3. The electronic device as claimed in claim 1, wherein a virtual extension line of a side edge of the first branch portion and a virtual extension line of a side edge of the second branch portion are overlapped with each other.

4. The electronic device as claimed in claim 1, wherein the first transistor is disposed opposite to the second transistor.

5. The electronic device as claimed in claim 1, wherein the first transistor comprises a first semiconductor, the second transistor comprises a second semiconductor, and an area of the first semiconductor of the first transistor is substantially the same as an area of the second semiconductor of the second transistor.

6. The electronic device as claimed in claim 1, further comprising:
a second bus line, electrically connected to at least one of the first driving unit and the second driving unit.

* * * * *